US012696658B2

(12) United States Patent
Chu et al.

(10) Patent No.: US 12,696,658 B2
(45) Date of Patent: Jul. 28, 2026

(54) DISPLAY APPARATUS HAVING AN AUXILIARY ELECTRODE

(71) Applicant: LG Display Co., Ltd., Seoul (KR)

(72) Inventors: Dong Il Chu, Paju-si (KR); Min Joo Kim, Paju-si (KR); Young Kyun Moon, Paju-si (KR); Sang Hyuk Won, Paju-si (KR); Seon Hee Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 332 days.

(21) Appl. No.: 18/521,566

(22) Filed: Nov. 28, 2023

(65) Prior Publication Data

US 2024/0215385 A1     Jun. 27, 2024

(30) Foreign Application Priority Data

Dec. 27, 2022     (KR) ........................ 10-2022-0185868

(51) Int. Cl.
*H10K 59/80* (2023.01)
*H10K 59/122* (2023.01)

(52) U.S. Cl.
CPC ..... *H10K 59/80522* (2023.02); *H10K 59/122* (2023.02)

(58) Field of Classification Search
CPC ............... H10K 50/814; H10K 50/824; H10K 59/80516; H10K 59/80522; H10K 59/122; H10K 59/131; H10K 59/814; H10K 59/824; H10K 59/124
See application file for complete search history.

(56) References Cited

U.S. PATENT DOCUMENTS

2017/0256597 A1     9/2017  Lee et al.
2018/0122882 A1*    5/2018  Lee ...................... H10K 59/123

FOREIGN PATENT DOCUMENTS

JP          2015-005434  A     1/2015
KR     10-2017-0104085  A     9/2017
KR     10-2021-0069219  A     6/2021

* cited by examiner

*Primary Examiner* — Vincent Wall
(74) *Attorney, Agent, or Firm* — Fenwick & West LLP

(57)     ABSTRACT

A display apparatus including an auxiliary electrode are disclosed. The display apparatus includes a contact area between pixel areas. The auxiliary electrode is within the contact area. A planarization layer covering the auxiliary electrode includes an inclined surface overlapping with the contact area and an upper surface extending from the inclined surface. A connection electrode covering the inclined surface and the upper surface of the planarization layer is connected to the auxiliary electrode. A light-emitting device on each pixel area has first and second electrodes and a light-emitting layer. The light-emitting layer and the second electrode extends onto the connection electrode. The light-emitting layer exposes a portion of the connection electrode by a reflow pattern, and the second electrode is in contact with the portion of the connection electrode exposed by the light-emitting layer. Thus, a process of connecting the second electrode and the connection electrode may be simplified.

15 Claims, 9 Drawing Sheets

DISPLAY APPARATUS HAVING AN AUXILIARY ELECTRODE

CROSS-REFERENCE TO RELATED APPLICATION

This application claims the benefit of Republic of Korea Patent Application No. 10-2022-0185868 filed on Dec. 27, 2022, which is hereby incorporated by reference in its entirety.

BACKGROUND

Field of Technology

The present disclosure relates to a display apparatus capable of preventing or at least reducing luminance deviation due to a voltage drop by using an auxiliary electrode.

Discussion of the Related Art

Generally, a display apparatus provides an image to a user. For example, the display apparatus may include a plurality of pixel areas. Each of the pixel areas may realize a specific color. For example, a light-emitting device may be disposed in each pixel area. The light-emitting device may emit light displaying a specific color. For example, the light-emitting device may have a stacked structure of a first electrode, a light-emitting layer and a second electrode.

An auxiliary electrode may be disposed between the pixel areas. The auxiliary electrode may prevent luminance deviation due to a voltage drop. For example, the second electrode of each light-emitting device may be electrically connected to the auxiliary electrode. An electrical connection between the second electrode of each light-emitting device and the auxiliary electrode may use an under-cut. For example, a method of forming the display apparatus may include a step of over-etching an insulating layer disposed at a relatively lower portion, using an etch selectivity of insulating layers stacked on the auxiliary electrode. However, in the display apparatus, a connection between the second electrode of each light-emitting device and the auxiliary electrode using the under-cut may be influenced by a process of forming the second electrode. That is, in the display apparatus, a process of forming the second electrode may be limited. Thus, in the display apparatus, a material of the second electrode may be limited. And, in the display apparatus, an aperture ratio may be decreased by a space for forming the under-cut.

SUMMARY

Accordingly, the present disclosure is directed to a display apparatus that substantially obviates one or more problems due to limitations and disadvantages of the related art.

An object of the present disclosure is to provide a display apparatus in which the second electrode of each light-emitting device is stably connected to the auxiliary electrode, without the restriction in a formation process.

Another object of the present disclosure is to provide a display apparatus capable of minimizing or at least reducing a space for electrically connection between the second electrode of each light-emitting device and the auxiliary electrode.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the present disclosure, as embodied and broadly described herein, there is provided a display apparatus comprising a device substrate. The device substrate includes a pixel area and a contact area. An auxiliary electrode is disposed on the contact area of the device substrate. A planarization layer is disposed on the auxiliary electrode. The planarization layer includes an inclined surface and an upper surface. The inclined surface overlaps the contact area. The upper surface extends from the inclined surface. The inclined surface and the upper surface of the planarization layer are covered by a connection electrode. The connection electrode is electrically connected to the auxiliary electrode. A reflow pattern is disposed on the connection electrode. The reflow pattern exposes at least a portion of the connection electrode on the inclined surface and the upper surface. A light-emitting device is disposed on the planarization layer of the pixel area. The light-emitting device has a stacked structure of a first electrode, a light-emitting layer and a second electrode. The light-emitting layer exposes at least a portion of the connection electrode in the portion of the connection electrode exposed by the reflow pattern. The second electrode contacts the portion of the connection electrode exposed by the light-emitting layer.

The reflow pattern may include a region having a concave shape toward the inclined surface.

A bank insulating layer may be disposed on the planarization layer. The bank insulating layer may cover an edge of the first electrode and an edge of the connection electrode. The reflow pattern may include a material different from the bank insulating layer.

The connection electrode may include a same material as the first electrode of the light-emitting device.

The upper surface of the planarization layer may have a length smaller than the inclined surface of the planarization layer.

The planarization layer may include an upper protruding portion having the inclined surface and the upper surface. The upper protruding portion of the planarization layer may have a thickness larger than the bank insulating layer.

An adhesion between the connection electrode and the reflow pattern and an adhesion between the connection electrode and the light-emitting layer may be smaller than an adhesion between the reflow pattern and the light-emitting layer.

The reflow pattern may include an organic insulating material.

In another embodiment, there is provided a display apparatus comprising a device substrate. The device substrate includes a pixel area and a contact area. An upper planarization layer is disposed on the pixel area and the contact area of the device substrate. The upper planarization layer includes an upper groove overlapping with the contact area. A reflow pattern is disposed within the upper groove of the upper planarization layer. The reflow pattern has a concave shape toward the device substrate. A connection electrode is disposed between the upper planarization layer and the reflow pattern. The connection electrode extends beyond the upper groove. An auxiliary electrode is disposed between the contact area of the device substrate and the upper planarization layer. The auxiliary electrode is electrically connected to the connection electrode. A light-emitting device is disposed on the upper planarization layer of the pixel area. The light-emitting device has a stacked structure of a first electrode, a light-emitting layer and a second electrode. The light-emitting layer includes a first region disposed on the first electrode and a second region disposed on the reflow pattern. The second electrode is in contact with the connection electrode between the first region and the second region of the light-emitting layer.

A maximum thickness of the reflow pattern may be smaller than a depth of the upper groove.

The second region of the light-emitting layer may include a region having a thickness smaller than the first region of the light-emitting layer.

A bank insulating layer may be disposed on the upper planarization layer. The bank insulating layer may cover an edge of the first electrode. The bank insulating layer may include an opening overlapping with the upper groove of the upper planarization. A sidewall of the upper groove may have an inclination angle greater than a sidewall of the opening.

A lower planarization layer may be disposed between the device substrate and the upper planarization layer. The auxiliary electrode may be disposed between the lower planarization layer and the upper planarization layer of the contact area.

The upper groove may penetrate the upper planarization. The connection electrode may contact the auxiliary electrode at a bottom surface of the upper groove.

A thin film transistor may be disposed between the pixel area of the device substrate and the lower planarization layer. An intermediate electrode may be disposed between the lower planarization layer and the upper planarization layer of the pixel area. The auxiliary electrode may include a same material as the intermediate electrode.

BRIEF DESCRIPTION OF THE DRAWINGS

The accompanying drawings, which are included to provide a further understanding of the present disclosure and are incorporated in and constitute a part of this application, illustrate embodiment(s) of the present disclosure and together with the description serve to explain the principle of the present disclosure. In the drawings:

FIG. 4 is an enlarged view of K1 region in FIG. 3 according to an embodiment of the present disclosure;

FIGS. 5A to 5E are views sequentially showing a method of forming the display apparatus according to the embodiment of the present disclosure.

DETAILED DESCRIPTION

Figure 1:
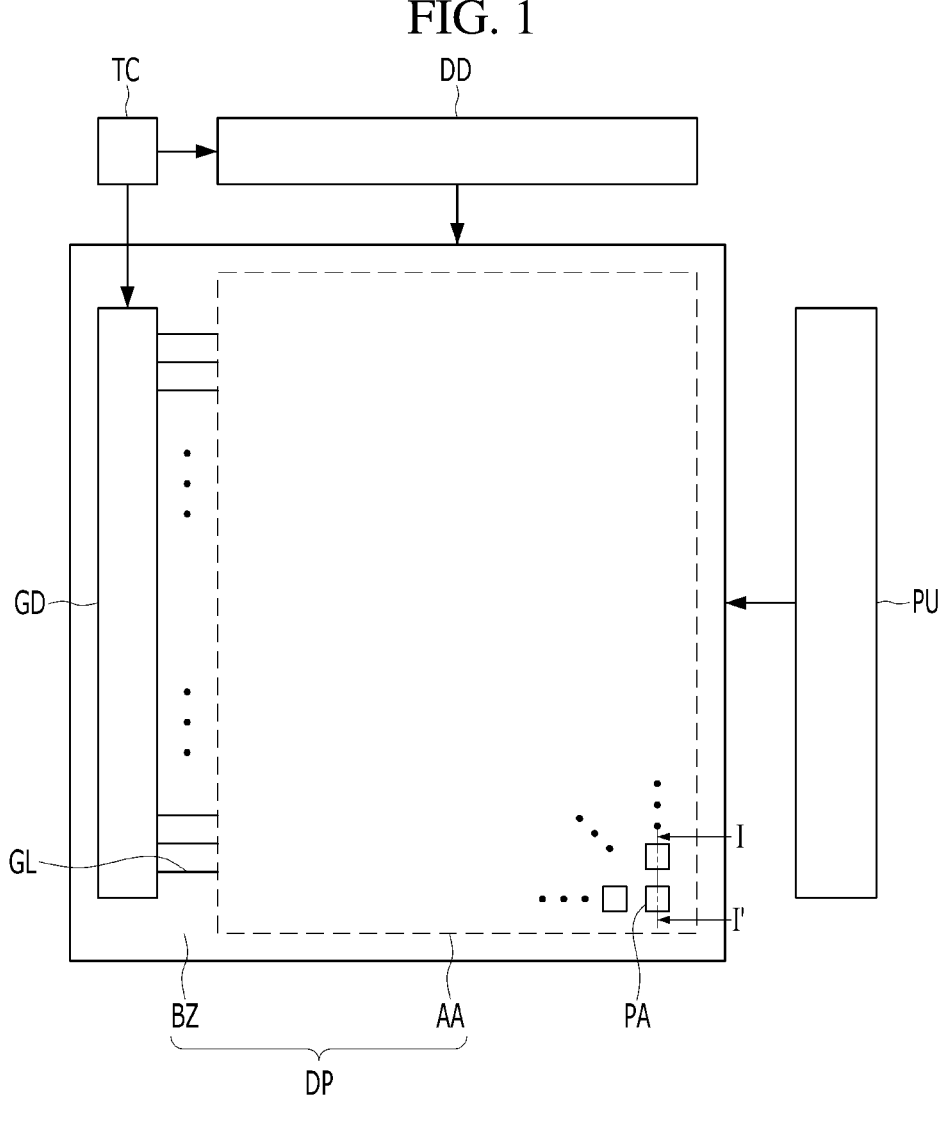
FIG. 1 is a view schematically showing a display apparatus according to an embodiment of the present disclosure.

Hereinafter, details related to the above objects, technical configurations, and operational effects of the embodiments of the present disclosure will be clearly understood by the following detailed description with reference to the drawings, which illustrate some embodiments of the present disclosure. Here, the embodiments of the present disclosure are provided in order to allow the technical sprit of the present disclosure to be satisfactorily transferred to those skilled in the art, and thus the present disclosure may be embodied in other forms and is not limited to the embodiments described below.

In addition, the same or extremely similar elements may be designated by the same reference numerals throughout the specification and in the drawings, the lengths and thickness of layers and regions may be exaggerated for convenience. It will be understood that, when a first element is referred to as being "on" a second element, although the first element may be disposed on the second element so as to come into contact with the second element, a third element may be interposed between the first element and the second element.

Here, terms such as, for example, "first" and "second" may be used to distinguish any one element with another element. However, the first element and the second element may be arbitrary named according to the convenience of those skilled in the art without departing the technical sprit of the present disclosure.

The terms used in the specification of the present disclosure are merely used in order to describe particular embodiments, and are not intended to limit the scope of the present disclosure. For example, an element described in the singular form is intended to include a plurality of elements unless the context clearly indicates otherwise. In addition, in the specification of the present disclosure, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

And, unless 'directly' is used, the terms "connected" and "coupled" may include that two components are "connected" or "coupled" through one or more other components located between the two components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiment

Figures 2, 3:
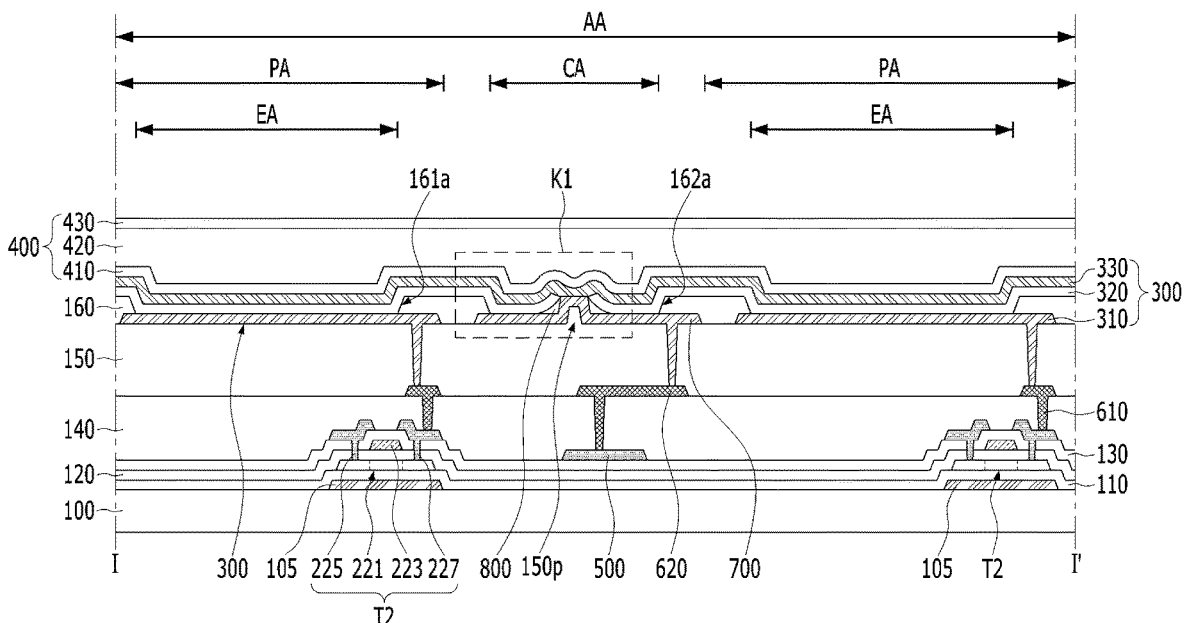
FIG. 2 is a view showing a circuit of a unit pixel area in the display apparatus according to the embodiment of the present disclosure.
FIG. 3 is a view taken along I-I' of FIG. 1 according to an embodiment of the present disclosure.
Figures 4, 5A:
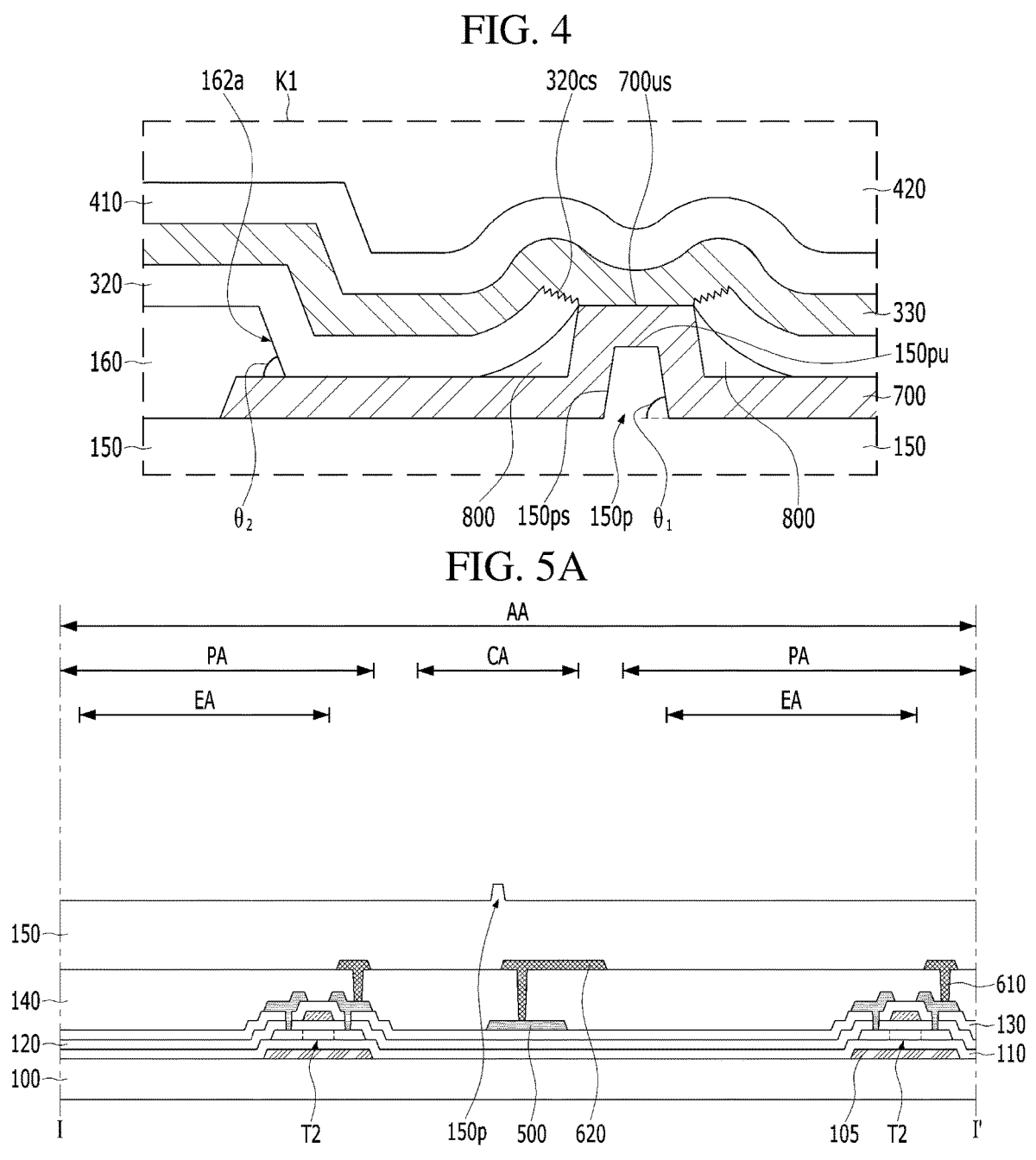

FIG. 1 is a view schematically showing a display apparatus according to an embodiment of the present disclosure. FIG. 2 is a view showing a circuit of a unit pixel area in the display apparatus according to the embodiment of the present disclosure. FIG. 3 is a view taken along I-I' of FIG. 1 according to an embodiment of the present disclosure. FIG. 4 is an enlarged view of K1 region in FIG. 3 according to an embodiment of the present disclosure.

Referring to FIGS. 1 to 4, the display apparatus according to the embodiment of the present disclosure may include a display panel DP. The display panel DP may generate an image provided to a user. For example, the display panel DP may include a plurality of pixel areas PA.

Various signals may be applied to each pixel area PA through signal wirings GL, DL and PL. For example, the signal wirings GL, DL and PL may include gate lines GL applying a gate signal to each pixel area PA, data lines DL applying a data signal to each pixel area PA, and power voltage supply lines PL supplying a positive power voltage (VDD) to each pixel area PA. The gate lines GL may be electrically connected to the gate driver GD. The data lines DL may be electrically connected to the data driver DD. The power voltage supply lines PL may be electrically connected to the power unit PU.

The gate driver GD and the data driver DD may be controlled by a timing controller TC. For example, the gate driver GD may receive clock signals, reset signals and a start signal from the timing controller TC, and the data driver DD may receive digital video data and a source timing signal from the timing controller TC.

The display panel DP may include the display area AA in which the pixel areas PA are disposed, and a bezel area BZ disposed outside the display area AA. At least one of the gate driver GD, the data driver DD, the power unit PU and the timing controller TC may be disposed on the bezel area BZ of the display panel DP. For example, the display apparatus according to the embodiment of the present disclosure may be a GIP (Gate In Panel) type display apparatus in which the gate driver GD is formed on the bezel area BZ of the display panel DP.

Each of the pixel areas PA may realize a specific color. For example, a light-emitting device 300 and a pixel driving circuit DC electrically connected to the light-emitting device 300 may be disposed in each pixel area PA. The light-emitting device 300 and the pixel driving circuit DC of each pixel area PA may be disposed on a device substrate 100. The device substrate 100 may include an insulating material. For example, the device substrate 100 may include glass or plastic.

The light-emitting device 300 may emit light displaying a specific color. For example, the light-emitting device 300 may include a first electrode 310, a light-emitting layer 320 and a second electrode 330, which are sequentially stacked on the device substrate 100.

The first electrode 310 may include a conductive material. The first electrode 310 may include a material having a high reflectance. For example, the first electrode 310 may include a metal, such as aluminum (Al) and silver (Ag). The first electrode 310 may have a multi-layer structure. For example, the first electrode 310 may have a structure in which a reflective electrode made of a metal is disposed between transparent electrodes made of a transparent conductive material, such as ITO and IZO.

The light-emitting layer 320 may generate light having luminance corresponding to a voltage difference between the first electrode 310 and the second electrode 330. For example, the light-emitting layer 320 may include an emission material layer (EML) having an emission material. The emission material may include an organic material, an inorganic material or a hybrid material. For example, the display apparatus according to the embodiment of the present disclosure may be an organic light-emitting display apparatus including an organic emission material.

The light-emitting layer 320 may have a multi-layer structure. For example, the light-emitting layer 320 may further include at least one of a hole injection layer (HIL), a hole transport layer (HTL), an electron transport layer (ETL) and an electron injection layer (EIL). Thus, in the display apparatus according to the embodiment of the present disclosure, the emission efficiency of the light-emitting layer 320 may be improved.

The second electrode 330 may include a conductive material. The second electrode 330 may include a material different from the first electrode 310. A transmittance of the second electrode 330 may be higher than a transmittance of the first electrode 310. For example, the second electrode 330 may be a transparent electrode made of a transparent conductive material, such as ITO and IZO, or a translucent electrode in which metals such as Ag and Mg are thinly formed. Thus, in the display apparatus according to the embodiment of the present disclosure, the light generated by the light-emitting layer 320 may be emitted outside through the second electrode 330.

The pixel driving circuit DC may supply a driving current corresponding to the data signal to the light-emitting device 300 according to gate signal for one frame. For example, the pixel driving circuit DC may include a first thin film transistor T1, a second thin film transistor T2 and a storage capacitor Cst.

The first thin film transistor T1 may transmit the data signal to the second thin film transistor T2 according to the gate signal. For example, the first thin film transistor T1 may be a switching thin film transistor. The first thin film transistor T1 may include a first semiconductor pattern, a first gate electrode, a first drain electrode and a first source electrode. For example, the first gate electrode may be electrically connected to the gate line GL, and the first drain electrode may be electrically connected to the date line DL.

The first semiconductor pattern may include a semiconductor material. For example, the first semiconductor pattern may include amorphous silicon (a-Si), polycrystalline silicon (poly-Si) or an oxide semiconductor, such as IGZO. The first semiconductor pattern may include a first drain region, a first channel region and a first source region. The first channel region may be disposed between the first drain region and the first source region. A resistance of the first drain region and a resistance of the first source region may be lower than a resistance of the first channel region. For example, the first drain region and the first source region may include a conductive region of an oxide semiconductor. The first channel region may be a region of an oxide semiconductor, which is not conductorized.

The first gate electrode may include a conductive material. For example, the first gate electrode may include a metal, such as aluminum (Al), chrome (Cr), copper (Cu), molybdenum (Mo), titanium (Ti) and tungsten (W). The first gate electrode may be disposed on the first semiconductor pattern. For example, the first gate electrode may overlap the first channel region of the first semiconductor pattern. The first drain region and the first source region of the first semiconductor pattern may be disposed outside the first gate electrode. The first gate electrode may be insulated from the first semiconductor pattern. For example, the first source region may be electrically connected to the first drain region according to the gate signal.

The first drain electrode may include a conductive material. For example, the first drain electrode may include a metal, such as aluminum (Al), chrome (Cr), copper (Cu), molybdenum (Mo), titanium (Ti) and tungsten (W). The first drain electrode may include a material different from the first gate electrode. The first drain electrode may be disposed on a layer different from the first gate electrode. The first drain electrode may be electrically connected to the first drain region of the first semiconductor pattern. For example, the first drain electrode may be insulated from the first gate electrode.

The first source electrode may include a conductive material. For example, the first source electrode may include a metal, such as aluminum (Al), chrome (Cr), copper (Cu), molybdenum (Mo), titanium (Ti) and tungsten (W). The first source electrode may include a material different from the first gate electrode. The first source electrode may be disposed on a layer different from the first gate electrode. For example, the first source electrode may be disposed on a same layer as the first drain electrode. The first source electrode may include a same material as the first drain electrode. For example, the first source electrode may be formed simultaneously with the first drain electrode. The first source electrode may be electrically connected to the first source region of the first semiconductor pattern. For example, the first source electrode may be insulated from the first gate electrode.

The second thin film transistor T2 may generate the driving current corresponding to the data signal. For example, the second thin film transistor T2 may be a driving thin film transistor. The second thin film transistor T2 may include a second semiconductor pattern 221, a second gate electrode 223, a second drain electrode 225 and a second source electrode 227. For example, the second gate electrode 223 may be electrically connected to the first source electrode of the first thin film transistor T1, the second drain electrode 225 may be electrically connected to the power voltage supply line PL. The light-emitting device 300 may be electrically connected to the second thin film transistor T2. For example, the second source electrode 227 may be electrically connected to the first electrode 310 of the light-emitting device 300. The second thin film transistor T2 may have a same structure as the first thin film transistor T1.

The second semiconductor pattern 221 may include a semiconductor material. For example, the second semiconductor pattern 221 may include amorphous silicon (a-Si), polycrystalline silicon (poly-Si) or an oxide semiconductor, such as IGZO. The second semiconductor pattern 221 may include a second channel region between a second drain region and a second source region. The second drain region and the second source region may have a resistance lower than the second channel region. For example, the second drain region and the second source region may include a conductive region of an oxide semiconductor. The second channel region may be a region of an oxide semiconductor, which is not conductorized.

The second semiconductor pattern 221 may include a same material as the first semiconductor pattern. For example, the second semiconductor pattern 221 may be formed simultaneously with the first semiconductor pattern. The second semiconductor pattern 221 may be disposed on a same layer as the first semiconductor pattern. The second drain region and the second source region of the second semiconductor pattern 221 may have a same resistance as the first drain region and the first source region of the first semiconductor pattern. For example, the second channel region of the second semiconductor pattern 221 may have a same resistance as the first channel region of the first semiconductor pattern.

The second gate electrode 223 may include a conductive material. For example, the second gate electrode 223 may include a metal, such as aluminum (Al), chrome (Cr), copper (Cu), molybdenum (Mo), titanium (Ti) and tungsten (W). The second gate electrode 223 may include a same material as the first gate electrode. For example, the second gate electrode 223 may be formed simultaneously with the first gate electrode. The second gate electrode 223 may be disposed on a same layer as the first gate electrode.

The second gate electrode 223 may be disposed on the second semiconductor pattern 221. For example, the second gate electrode 223 may overlap the second channel region of the second semiconductor pattern 221. The second drain region and the second source region of the second semiconductor pattern 221 may be disposed outside the second gate electrode 223. The second gate electrode 223 may be insulated from the second semiconductor pattern 221. For example, the second channel region of the second semiconductor pattern 221 may have an electrical conductivity corresponding to a voltage applied to the second gate electrode 223.

The second drain electrode 225 may include a conductive material. For example, the second drain electrode 225 may include a metal, such as aluminum (Al), chrome (Cr), copper (Cu), molybdenum (Mo), titanium (Ti) and tungsten (W). The second drain electrode 225 may include a material different from the second gate electrode 223. The second drain electrode 225 may be disposed on a layer different from the second gate electrode 223. For example, the second drain electrode 225 may be insulated from the second gate electrode 223. The second drain electrode 225 may be electrically connected to the second drain region of the second semiconductor pattern 221.

The second drain electrode 225 may include a same material as the first drain electrode. The second drain electrode 225 may be disposed on a same layer as the first drain electrode. For example, the second drain electrode 225 may be formed simultaneously with the first drain electrode. Thus, in the display apparatus according to the embodiment of the present disclosure, process efficiency may be improved.

The second source electrode 227 may include a conductive material. For example, the second source electrode 227 may include a metal, such as aluminum (Al), chrome (Cr), copper (Cu), molybdenum (Mo), titanium (Ti) and tungsten (W). The second source electrode 227 may include a material different from the second gate electrode 223. The second source electrode 227 may be disposed on a layer different from the second gate electrode 223. For example, the second source electrode 227 may be insulated from the second gate electrode 223. The second source electrode 227 may be electrically connected to the second source region of the second semiconductor pattern 221.

The second source electrode 227 may be disposed on a same layer as the first source electrode. For example, the second source electrode 227 may include a same material as the first source electrode. For example, the second source electrode 227 may be formed simultaneously with the first source electrode. Thus, in the display apparatus according to the embodiment of the present disclosure, process efficiency may be improved.

The storage capacitor Cst may maintain a signal applied to the second gate electrode 223 of the second thin film transistor T2 for one frame. For example, the storage capacitor Cst may be electrically connected between the second gate electrode 223 and the second source electrode 227 of the second thin film transistor T2. The storage capacitor Cst may have a stacked structure of capacitor electrodes. The storage capacitor Cst may be formed using a process of forming the first thin film transistor T1 and the second thin film transistor T2. For example, the storage capacitor Cst may include a first capacitor electrode disposed on a same layer as the second gate electrode 223 and a second capacitor electrode disposed on a same layer as the second source electrode 227.

A plurality of insulating layers 110, 120, 130, 140, 150 and 160 for preventing unnecessary electrical connection in each pixel area PA may be disposed on the device substrate 100. For example, a device buffer layer 110, a gate insulating layer 120, an interlayer insulating layer 130, a lower planarization layer 140, an upper planarization layer 150 and a bank insulating layer 160 may be disposed on the device substrate 100.

The device buffer layer 110 may be disposed close to the device substrate 100. The device buffer layer 110 may prevent or at least reduce pollution due to the device substrate 100 in a process of forming the pixel driving circuit DC of each pixel area PA. For example, a surface of the device substrate 100 may be completely covered by the device buffer layer 110. The pixel driving circuit DC and the light-emitting device 300 of each pixel area PA may be disposed on the device buffer layer 110. The device buffer layer 110 may include an insulating material. For example, the device buffer layer 110 may include an inorganic insulating material, such as silicon oxide (SiOx) and silicon nitride (SiNx). The device buffer layer 110 may include a multi-layer structure. For example, the device buffer layer 110 may have a stacked structure of an inorganic insulating layer made of silicon oxide (SiOx) and an inorganic insulating layer made of silicon nitride (SiNx).

Light-blocking patterns 105 may be disposed between the device substrate and the device buffer layer 110. Each of the light-blocking patterns 105 may block light travelling toward the pixel driving circuit DC of each pixel area PA passing through the device substrate 100. For example, the light-blocking patterns 105 may include a metal. Each of the light-blocking patterns 105 may overlap one of the thin film transistors T1 and T2. For example, the second semiconductor pattern 221 of each pixel area PA may be disposed on one of the light-blocking patterns 105. Thus, in the display apparatus according to the embodiment of the present disclosure, change in characteristics of the pixel driving circuit DC in each pixel area PA due to external light passing through the device substrate 100 may be prevented.

The gate insulating layer 120 may insulate the gate electrodes 223 of each pixel area PA from the corresponding semiconductor pattern 221. For example, the first semiconductor pattern and the second semiconductor pattern 221 of each pixel area PA may be covered by the gate insulating layer 120. The first gate electrode and the second gate electrode 223 of each pixel area PA may be disposed on the gate insulating layer 120. The gate insulating layer 120 may include an insulating material. For example, the gate insulating layer 120 may include an inorganic insulating material, such as silicon oxide (SiOx).

The interlayer insulating layer 130 may insulate the drain electrodes 225 and the source electrodes 227 of each pixel area PA from the corresponding gate electrode 223. For example, the first gate electrode and the second gate electrode 223 of each pixel area PA may be covered by the interlayer insulating layer 130. The first drain electrode, the first source electrode, the second drain electrode 225 and the second source electrode 227 of each pixel area PA may be disposed on the interlayer insulating layer 130. The interlayer insulating layer 130 may include an insulating material. For example, the interlayer insulating layer 130 may include an inorganic insulating material, such as silicon oxide (SiOx) and silicon nitride (SiNx). The interlayer insulating layer 130 may include a multi-layer structure. For example, the interlayer insulating layer 130 may have a stacked structure of an inorganic insulating layer made of silicon oxide (SiOx) and an inorganic insulating layer made of silicon nitride (SiNx).

The lower planarization layer 140 and the upper planarization layer 150 may be disposed on the interlayer insulating layer 130. The lower planarization layer 140 may be disposed between the interlayer insulating layer 130 and the upper planarization layer 150. For example, the first drain electrode, the first source electrode, the second drain electrode 225 and the second source electrode 227 of each pixel area PA may be covered by the lower planarization layer 140. The lower planarization layer 140 and the upper planarization layer 150 may remove a thickness difference due to the pixel driving circuit DC of each pixel area PA. For example, an upper surface of the upper planarization layer 150 opposite to the device substrate 100 may be a flat surface.

The lower planarization layer 140 and the upper planarization layer 150 may include an insulating material. The lower planarization layer 140 and the upper planarization layer 150 may include a material different from the interlayer insulating layer 130. For example, the lower planarization layer 140 and the upper planarization layer 150 may be an organic insulating material. The upper planarization layer 150 may include a same material as the lower planarization layer 140. For example, a boundary surface between the lower planarization layer 140 and the upper planarization layer 150 may be not recognized.

The light-emitting device 300 of each pixel area PA may be disposed on the upper planarization layer 150. For example, the first electrode 310, the light-emitting layer 320 and the second electrode 330 of each pixel area PA may be sequentially stacked on the upper planarization layer 150 of the corresponding pixel area PA. The first electrode 310 of each pixel area PA may be in direct contact with the upper surface of the upper planarization layer 150. Thus, in the display apparatus according to the embodiment of the present disclosure, luminance deviation due to generating location of light emitted from each light-emitting device 300 may be prevented or at least reduced.

An intermediate electrode 610 may be disposed between the lower planarization layer 140 and the upper planarization layer 150 of each pixel area PA. The intermediate electrode 610 of each pixel area PA may be electrically connected to the pixel driving circuit DC and the light-emitting device 300 of the corresponding pixel area PA. For example, the intermediate electrode 610 of each pixel area PA may be in direct contact with the second source electrode 227 of the corresponding pixel area PA by penetrating the lower planarization layer 140, and the first electrode 310 of each pixel area PA may be in direct contact with the intermediate electrode 610 of the corresponding pixel area PA by penetrating the upper planarization layer 150. That is, in the display apparatus according to the embodiment of the present disclosure, the first electrode 310 of each pixel area PA may be electrically connected to the second source electrode 227 of the corresponding pixel area PA through one of the intermediate electrodes 610. Thus, in the display apparatus according to the embodiment of the present disclosure, the light-emitting device 300 of each pixel area PA may be stably connected to the pixel driving circuit DC of the corresponding pixel area PA. The intermediate electrodes 610 may include a conductive material. For example, the intermediate electrodes 610 may include a metal, such as aluminum (Al), chrome (Cr), copper (Cu), molybdenum (Mo), titanium (Ti) and tungsten (W).

A bank insulating layer 160 may be disposed on the upper planarization layer 150. The bank insulating layer 160 may define an emission area EA in each pixel area PA. For example, the bank insulating layer 160 may include first openings 161a overlapping with the pixel areas PA. Each of the first openings 161a may overlap a portion of the first electrode 310 disposed in the corresponding pixel area PA. For example, an edge of the first electrode 310 in each pixel area PA may be covered by the bank insulating layer 160. The light-emitting layer 320 and the second electrode 330 of each pixel area PA may be sequentially stacked on the portion of the corresponding first electrode 310 exposed by one of the first openings 161a. The bank insulating layer 160 may include an insulating material. For example, the bank insulating layer 160 may include an organic insulating material. The bank insulating layer 160 may include a material different from the lower planarization layer 140 and the upper planarization layer 150.

At least a part of the light-emitting layer 320 in each pixel area PA may extend onto the bank insulating layer 160. For example, at least one of the hole injection layer (HIL), the hole transport layer (HTL), the electron transport layer (ETL) and the electron injection layer (EIL) of the light-emitting layer 320 in each pixel area PA may be in direct contact with the corresponding layer of the light-emitting layer 320 in adjacent pixel area PA. At least one of the hole injection layer (HIL), the hole transport layer (HTL), the electron transport layer (ETL) and the electron injection layer (EIL) of the light-emitting layer 320 in each pixel area PA may include a same material as the corresponding layer of the light-emitting layer 320 in adjacent pixel area PA. At least one of the hole injection layer (HIL), the hole transport layer (HTL), the electron transport layer (ETL) and the electron injection layer (EIL) of the light-emitting layer 320 in each pixel area PA may be formed simultaneously with the corresponding layer of the light-emitting layer 320 in adjacent pixel area PA. For example, at least one of the hole injection layer (HIL), the hole transport layer (HTL), the electron transport layer (ETL) and the electron injection layer (EIL) may be formed on an entire surface of the display area AA. Thus, in the display apparatus according to the embodiment of the present disclosure, process efficiency may be improved.

A voltage applied to the second electrode 330 of each pixel area PA may be a same as a voltage applied to the second electrode 330 of adjacent pixel area PA. For example, a negative power voltage (VSS) may be supplied to the second electrode 330 of each pixel area PA. The second electrode 330 of each pixel area PA may be electrically connected to the second electrode 330 of adjacent pixel area PA. The second electrode 330 of each pixel area PA may include a same material as the second electrode 330 of adjacent pixel area PA. For example, the second electrode 330 of each pixel area PA may be formed simultaneously with the second electrode 330 of adjacent pixel area PA. The second electrode 330 of each pixel area PA may be in direct contact with the second electrode 330 of adjacent pixel area PA. For example, the second electrode 330 of each pixel PA may extend onto the bank insulating layer 160. The bank insulating layer 160 may be covered by the second electrode 330. Thus, in the display apparatus according to the embodiment of the present disclosure, a process of forming the second electrode 330 in each pixel area PA may be simplified. And, in the display apparatus according to the embodiment of the present disclosure, the luminance of the light emitted from the light-emitting device 300 of each pixel area PA may be adjusted by the data signal applied to the pixel driving circuit DC of the corresponding pixel area PA.

An encapsulation unit 400 may be disposed on the light-emitting device 300 of each pixel area PA. The encapsulation unit 400 may prevent or at least reduce damage of the light-emitting devices 300 due to external moisture and impact. The encapsulation unit 400 may have a multi-layer structure. For example, the encapsulation unit 400 may include a first encapsulating layer 410, a second encapsulating layer 420 and a third encapsulating layer 430, which are sequentially stacked. The first encapsulating layer 410, the second encapsulating layer 420 and the third encapsulating layer 430 may include an insulating material. The second encapsulating layer 420 may include a material different from the first encapsulating layer 410 and the third encapsulating layer 430. For example, the first encapsulating layer 410 and the third encapsulating layer 430 may be an inorganic insulating layer made of silicon nitride (SiNx) or silicon oxide (SiOx), and the second encapsulating layer 420 may an organic insulating layer made of an organic insulating material. Thus, in the display apparatus according to the embodiment of the present disclosure, the damages of the light-emitting devices 300 due to the external moisture and impact may be effectively prevented.

The display area AA of the device substrate 100 may include a contact area CA between the pixel areas PA. An auxiliary electrode 500 may be disposed on the contact area CA of the device substrate 100. The pixel areas PA may be disposed side by side within the display area AA in a first direction and a second direction perpendicular to the first direction. For example, the pixel areas PA may be arranged in a matrix form. The auxiliary electrode 500 may extend between the pixel areas PA. For example, a planar shape of the auxiliary electrode 500 may be a mesh shape.

The auxiliary electrode 500 may include a conductive material. The auxiliary electrode 500 may include a material having a relative low resistance. For example, the auxiliary electrode 500 may include a metal, such as aluminum (Al), chrome (Cr), copper (Cu), molybdenum (Mo), titanium (Ti) and tungsten (W). The auxiliary electrode 500 may be formed using a process of forming the pixel driving circuit DC in each pixel area PA. A portion of the auxiliary electrode 500 extending parallel to the data line DL may include a material different from a portion of the auxiliary electrode 500 extending parallel to the gate line GL. For example, the portion of the auxiliary electrode 500 extending parallel to the data line DL may include a same material as the second drain electrode 225 and the second source electrode 227 of each pixel area PA, and the portion of the auxiliary electrode 500 extending parallel to the gate line GL may include a same material as the second gate electrode 223 of each pixel area PA. Thus, in the display apparatus according to the embodiment of the present disclosure, a process of forming the auxiliary electrode 500 may be simplified. Therefore, in the display apparatus according to the embodiment of the present disclosure, process efficiency may be improved.

The upper planarization layer 150 may include an upper protruding portion 150p overlapping with the contact area CA. The upper protruding portion 150p may include an inclined surface 150ps and an upper surface 150pu extending from the inclined surface 150ps. The upper surface 150pu of the upper protruding portion 150p may be a surface of the upper protruding portion 150p opposite to the device substrate 100. The bank insulating layer 160 may include a second opening 162a overlapping with the contact area CA. For example, the inclined surface 150ps and the upper surface 150pu of the upper protruding portion 150p may be disposed within the second opening 162a of the bank insulating layer 160.

An upper connection electrode 700 may be disposed on the upper planarization layer 150 of the contact area CA. The upper connection electrode 700 may include a region overlapping with the second opening 162a of the bank insulating layer 160. For example, an edge of the upper connection electrode 700 may be covered by the bank insulating layer 160. The inclined surface 150*ps* and the upper surface 150*pu* of the upper protruding portion 150*p* may be covered by the upper connection electrode 700.

The upper connection electrode 700 may include a conductive material. For example, the upper connection electrode 700 may include a metal. The upper connection electrode 700 may be in direct contact with the upper surface of the upper planarization layer 150. For example, the upper connection electrode 700 may be disposed on a same layer as the first electrode 310 of each pixel area PA. The upper connection electrode 700 may include a same material as the first electrode 310 of each pixel area PA. For example, the upper connection electrode 700 may be formed simultaneously with the first electrode 310 of each pixel area PA. The light-emitting layer 320 and the second electrode 330 may include a region overlapping with the contact area CA. For example, the upper connection electrode 700 may be disposed between the upper planarization layer 150 and the light-emitting layer 320 of the contact area CA.

A lower connection electrode 620 may be disposed between the lower planarization layer 140 and the upper planarization layer 150 of the contact area CA. The upper connection electrode 700 may be electrically connected to the auxiliary electrode 500 through the lower connection electrode 620. For example, the lower connection electrode 620 may be in direct contact with the auxiliary electrode 500 by penetrating the lower planarization layer 140, and the upper connection electrode 700 may be in direct contact with the lower connection electrode 620 by penetrating the upper planarization layer 150. Thus, in the display apparatus according to the embodiment of the present disclosure, the upper connection electrode 700 may be stably connected to the auxiliary electrode 500.

The lower connection electrode 620 may include a conductive material. For example, the lower connection electrode 620 may include a metal. The lower connection electrode 620 may be disposed on a same layer as the intermediate electrodes 610. The lower connection electrode 620 may include a same material as the intermediate electrodes 610. For example, the lower connection electrode 620 may be formed simultaneously with the intermediate electrodes 610. Thus, in the display apparatus according to the embodiment of the present disclosure, a decrease in the process efficiency due to the lower connection electrode 620 may be prevented.

A reflow pattern 800 may be disposed between the upper connection 700 and the light-emitting layer 320. The reflow pattern 800 may expose at least a portion of the upper connection electrode 700 on the inclined surface 150*ps* and the upper surface 150*pu* of the upper protruding portion 150*p*. For example, a partial surface 700*us* of the upper connection electrode 700 formed on the upper protruding portion 150*p* may not overlap the reflow pattern 800. The light-emitting layer 320 may expose the partial surface 700*us* of the upper connection electrode 700 exposed by the reflow pattern 800. For example, the second electrode 330 disposed on the contact area CA may be in direct contact with the partial surface 700*us* of the upper connection electrode 700 formed on the upper protruding portion 150*p*. The negative power voltage may be applied to the auxiliary electrode 500. Thus, in the display apparatus according to the embodiment of the present disclosure, luminance deviation due to a voltage drop may be prevented by the auxiliary electrode 500.

The light-emitting layer 320 may be in direct contact with the reflow pattern 800. A side surface 320*cs* of the light-emitting layer 320 toward the partial surface 700*us* of the upper connection electrode 700 exposed by the reflow pattern 800 may have a relatively large surface roughness. For example, the side surface 320*cs* of the light-emitting layer 320 disposed on the contact area CA may have a torn shape. The side surface 320*cs* of the light-emitting layer 320 may be covered by the second electrode 330. Thus, in the display apparatus according to the embodiment of the present disclosure, the penetration of the external moisture due to the side surface 320*cs* of the light-emitting layer 320 may be prevented.

FIGS. 5A to 5E are views sequentially showing a method of forming the display apparatus according to the embodiment of the present disclosure.

Figures 5B, 5C:
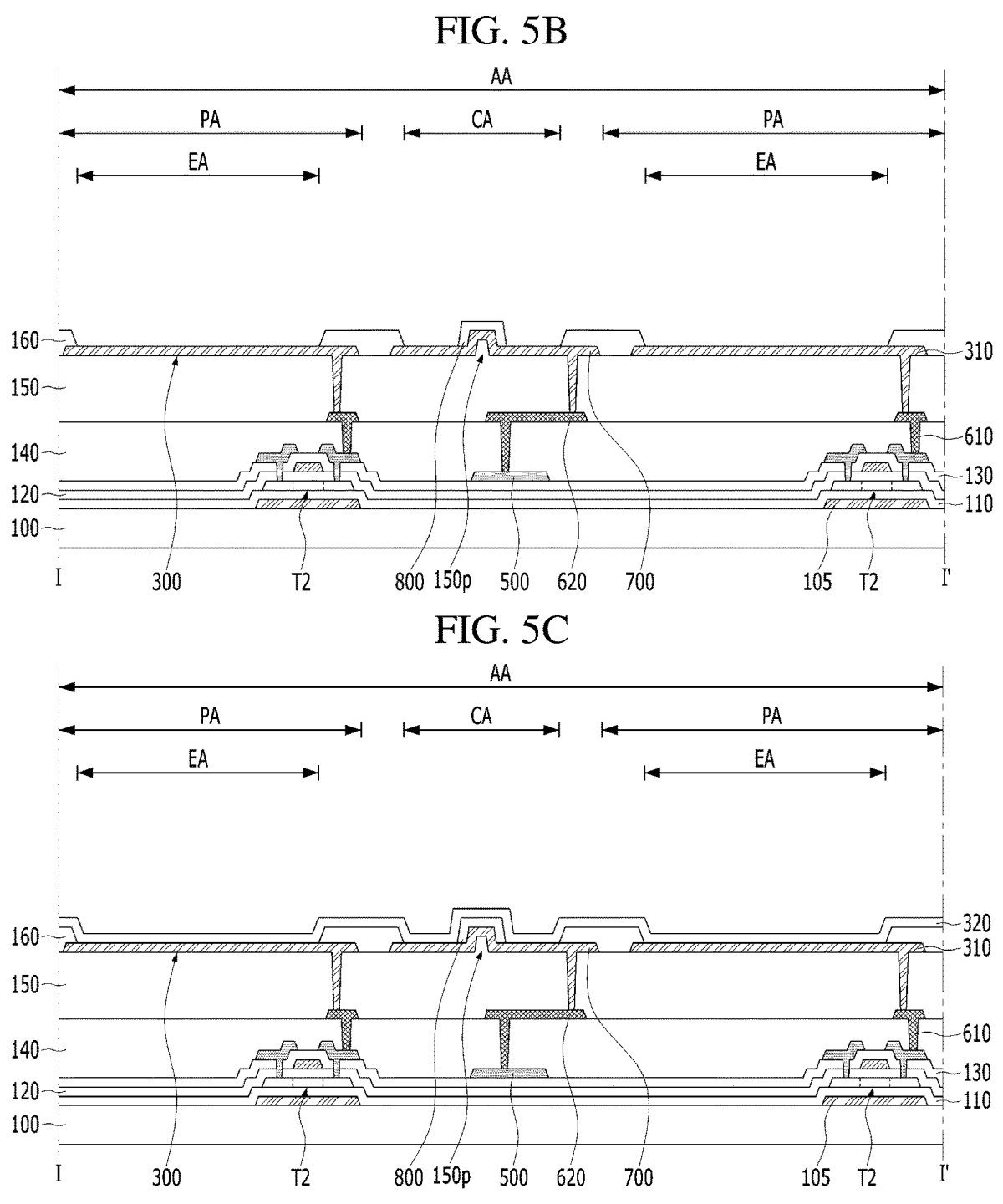
Figures 5D, 5E:
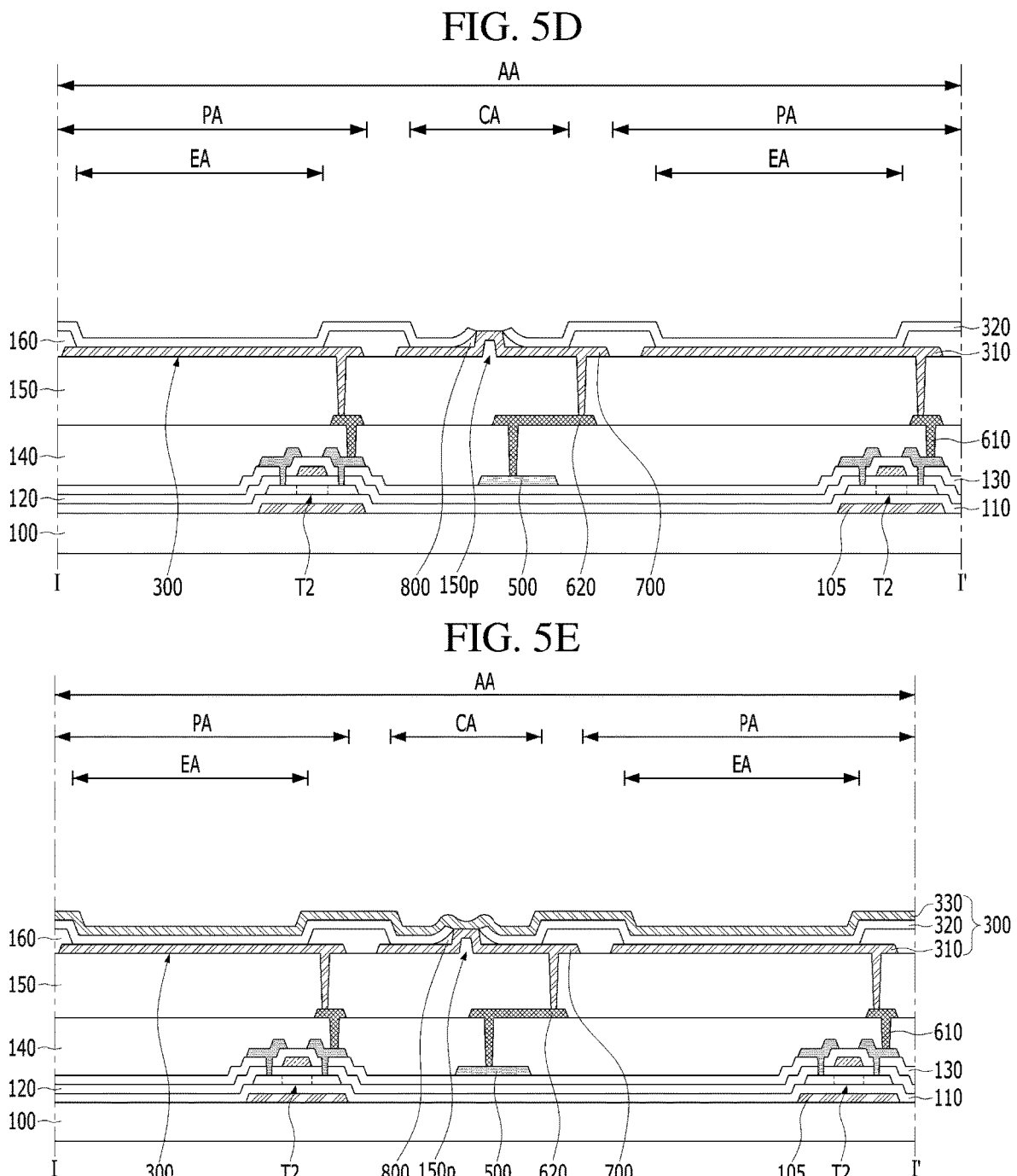

The method of forming the display apparatus according to the embodiment of the present disclosure will be described with reference to FIGS. 3, 4 and 5A to 5E. First, the method of forming the display apparatus according to the embodiment of the present disclosure may include a step of forming the pixel driving circuit DC including the thin film transistors T2 on each pixel area PA of the device substrate 100, a step of forming the auxiliary electrode 500 on the contact area CA of the device substrate 100, a step of forming the lower planarization layer 140 on the pixel driving circuit DC of each pixel area PA and the auxiliary electrode 500, a step of forming the intermediate electrode 610 on the lower planarization layer 140 of each pixel area PA, a step of forming the lower connection electrode 620 on the lower planarization layer 140 of the contact area CA, and a step of forming the upper planarization layer 150 on the intermediate electrodes 610 and the lower connection electrode 620, as shown in FIG. 5A.

The intermediate electrode 610 of each pixel area PA may be electrically connected to the pixel driving circuit DC of the corresponding pixel area PA. For example, the step of forming the intermediate electrodes 610 may include a step of forming lower contact holes partially exposing the second thin film transistor T2 in each pixel area PA at the lower planarization layer 140, a step of forming a conductive layer filling the lower contact holes on the lower planarization layer 140, and a step of patterning the conductive layer.

The lower connection electrode 620 may be electrically connected to the auxiliary electrode 500. For example, the step of forming the lower connection electrode 620 may include a step of forming an auxiliary contact hole exposing at least a portion of the auxiliary electrode 500 at the lower planarization layer 140, a step of forming a conductive layer filling the auxiliary contact hole on the lower planarization layer 140, and a step of patterning the conductive layer. The lower connection electrode 620 may be formed of a same material as the intermediate electrodes 610. For example, the lower connection electrode 620 may be formed simultaneously with the intermediate electrodes 610.

The upper planarization layer 150 may include the upper protruding portion 150*p* overlapping with the contact area CA. The upper protruding portion 150*p* may be formed of a same material as the upper planarization layer 150. For example, the step of forming the upper planarization layer 150 may include a step of forming an insulating layer covering the intermediate electrodes 610 and the lower connection electrode 620, and a step of recessing an upper portion of the insulating layer around the pixel areas PA and the upper protruding portion 150*p*. A boundary surface between the upper planarization layer 150 and the upper protruding portion 150*p* may be not recognized.

The method of forming the display apparatus according to the embodiment of the present disclosure may include a step of forming the first electrode 310 on the upper planarization layer 150 of each pixel area PA, a step of forming the upper connection electrode 700 on the upper planarization layer 150 of the contact area CA, a step of forming the bank insulating layer 160 covering an edge of the first electrode 310 in each pixel area PA and an edge of the upper connection electrode 700, and a step of forming the reflow pattern 800 on a portion of the upper connection electrode 700 covering the upper protruding portion 150*p*, as shown in FIG. 5B.

The reflow pattern 800 may be formed of an insulating material. For example, the reflow pattern 800 may be formed of an organic insulating material. The reflow pattern 800 may be formed of a material different from the bank insulating layer 160. For example, a process of forming the bank insulating layer 160 and a process of forming the reflow pattern 800 may be independently performed. For example, an upper surface of the reflow pattern 800 opposite to the device substrate 100 may have a location different from an upper surface of the bank insulating layer 160 opposite to the device substrate 100. A distance between the device substrate 100 and the upper surface of the reflow pattern 800 may be different from a distance between the device substrate 100 and the upper surface of the bank insulating layer 160.

The method of forming the display apparatus according to the embodiment of the present disclosure may include a step of forming the light-emitting layer 320 on each pixel area PA of the device substrate 100 in which the bank insulating layer 160 and the reflow pattern 800 are formed, as shown in FIG. 5C.

The light-emitting layer 320 of each pixel area PA may have a multi-layer structure. For example, the light-emitting layer 320 of each pixel area PA may include the hole injection layer (HIL), the hole transport layer (HTL), the emission material layer (EML), the electron transport layer (ETL) and the electron injection layer (EIL). At least one of the hole injection layer (HIL), the hole transport layer (HTL), the emission material layer (EML), the electron transport layer (ETL) and the electron injection layer (EIL) may extend beyond the corresponding pixel area PA. For example, the hole injection layer (HIL), the hole transport layer (HTL), the electron transport layer (ETL) and the electron injection layer (EIL) may be formed on an entire surface of the device substrate 100. The hole injection layer (HIL), the hole transport layer (HTL), the electron transport layer (ETL) and the electron injection layer (EIL) may be stacked on the contact area CA. For example, the reflow pattern 800 may be covered by the light-emitting layer 320.

The method of forming the display apparatus according to the embodiment of the present disclosure may include a step of exposing the partial surface 700*us* of the upper connection electrode 700 formed on the upper protruding portion 150*p*, as shown in FIG. 5D.

The step of exposing the partial surface 700*us* of the upper connection electrode 700 may include a reflow process of the reflow pattern 800. The reflow pattern 800 may be moved outside the partial surface 700*us* of the upper connection electrode 700 by the reflow process. For example, the reflow pattern 800 may flow down along the inclined surface of the upper protruding portion 150*p* by the reflow process. Thus, in the method of forming the display apparatus according to the embodiment of the present disclosure, the reflow pattern 800 may include a region having a concave shape toward the inclined surface, as shown in FIG. 4. The reflow process may be performed at a temperature at which the light-emitting layer 320 is not deteriorated. For example, the reflow process may be performed at a temperature of 100° C. or less. Therefore, in the method of forming the display apparatus according to the embodiment of the present disclosure, the reflow pattern 800 may be moved, without the deterioration of the light-emitting layer 320.

The reflow pattern 800 may be formed of a material having relatively high adhesion to the light-emitting layer 320. For example, the reflow pattern 800 may include epoxy resin and acrylate. Thus, in the method of forming the display apparatus according to the embodiment of the present disclosure, an adhesion between the upper connection electrode 700 and the reflow pattern 800 and an adhesion between the upper connection electrode 700 and the light-emitting layer 320 may be smaller than an adhesion between the reflow pattern 800 and the light-emitting layer 320. That is, in the method of forming the display apparatus according to the embodiment of the present disclosure, the light-emitting layer 320 may be moved outside the partial surface 700*us* of the upper connection electrode 700 together with the reflow pattern 800. For example, in the method of forming the display apparatus according to the embodiment of the present disclosure, a portion of the light-emitting layer 320 disposed on the partial surface 700*us* of the upper connection electrode 700 may be torn by the reflow process. Therefore, in the method of forming the display apparatus according to the embodiment of the present disclosure, the side surface 320*cs* of the light-emitting layer 320 toward the partial surface 700*us* of the upper connection electrode 700 exposed by the reflow process may have a relatively large surface roughness, as shown in FIG. 4.

The method of forming the display apparatus according to the embodiment of the present disclosure may include a step of forming the second electrode 330 on the device substrate 100 in which the partial surface 700*us* of the upper connection electrode 700 is exposed by the reflow pattern 800 and the light-emitting layer 320, as shown in FIG. 5E.

The second electrode 330 may be formed on the pixel areas PA and the contact area CA of the device substrate 100. For example, the second electrode 330 may be in direct contact with the partial surface 700*us* of the upper connection electrode 700 exposed by the reflow pattern 800 and the light-emitting layer 320. The side surface 320*cs* of the light-emitting layer 320 toward the partial surface 700*us* of the upper connection electrode 700 may be covered by the second electrode 330. Thus, in the method of forming the display apparatus according to the embodiment of the present disclosure, the second electrode 330 of each light-emitting device 300 may be electrically connected to the auxiliary electrode 500, without forming an under-cut.

The method of forming the display apparatus according to the embodiment of the present disclosure may include a step of forming the encapsulation unit 400 on the second electrode 330, as shown in FIGS. 3 and 4.

The encapsulation unit 400 may include a first encapsulating layer 410, a second encapsulating layer 420 and a third encapsulating layer 430, which are sequentially stacked on the second electrode 330. For example, the step of forming the encapsulation unit 400 may include a step of forming the first encapsulating layer 410 on the second electrode 330, a step of forming the second encapsulating layer 420 on the first encapsulating layer 410, and a step of forming the third encapsulating layer 430 on the second encapsulating layer 420.

Accordingly, in the display apparatus according to the embodiment of the present disclosure, the reflow pattern 800 and the light-emitting layer 320 may expose the partial surface 700*us* of the upper connection electrode 700 by the reflow process of the reflow pattern 800 disposed on a portion of the upper connection electrode 700 covering the upper protruding portion 150*p*, and the second electrode 330 may be in direct contact with the partial surface 700*us* of the upper connection electrode 700 exposed by the reflow pattern 800 and the light-emitting layer 320. Thus, in the display apparatus according to the embodiment of the present disclosure, the second electrode 330 of each light-emitting device 300 may be electrically connected to the auxiliary electrode 500, without forming an under-cut. That is, in the display apparatus according to the embodiment of the present disclosure, the second electrode 330 of each light-emitting device 300 may be electrically connected to the auxiliary electrode 500, without the restriction in a formation process and a material of the second electrode 330. Therefore, in the display apparatus according to the embodiment of the present disclosure, a process for electrically connecting the second electrode 330 of each light-emitting device 300 and the auxiliary electrode 500 may be optimized. And, in the display apparatus according to the embodiment of the present disclosure, a space for electrically connection between the second electrode 330 of each light-emitting device 300 and the auxiliary electrode 500 may be minimized or at least reduced.

In the display apparatus according to the embodiment of the present disclosure, the upper surface 150*pu* of the upper protruding portion 150*p* may have a length smaller than the inclined surface 150*ps* of the upper protruding portion 150*p*, and an inclination angle $\theta_1$ of the inclined surface 150*ps* of the upper protruding portion 150*p* may be greater than an inclination angle $\theta_2$ of a sidewall of the second opening 162*a*. Thus, in the display apparatus according to the embodiment of the present disclosure, a portion of the light-emitting layer 320 formed on the upper protruding portion 150*p* may have a relatively small thickness. That is, in the display apparatus according to the embodiment of the present disclosure, a portion of the light-emitting layer 320 may be rapidly separated by the reflow process. Therefore, in the display apparatus according to the embodiment of the present disclosure, the deterioration of the light-emitting layer 320 due to the reflow process may be effectively prevented or at least reduced.

Figures 6, 7:
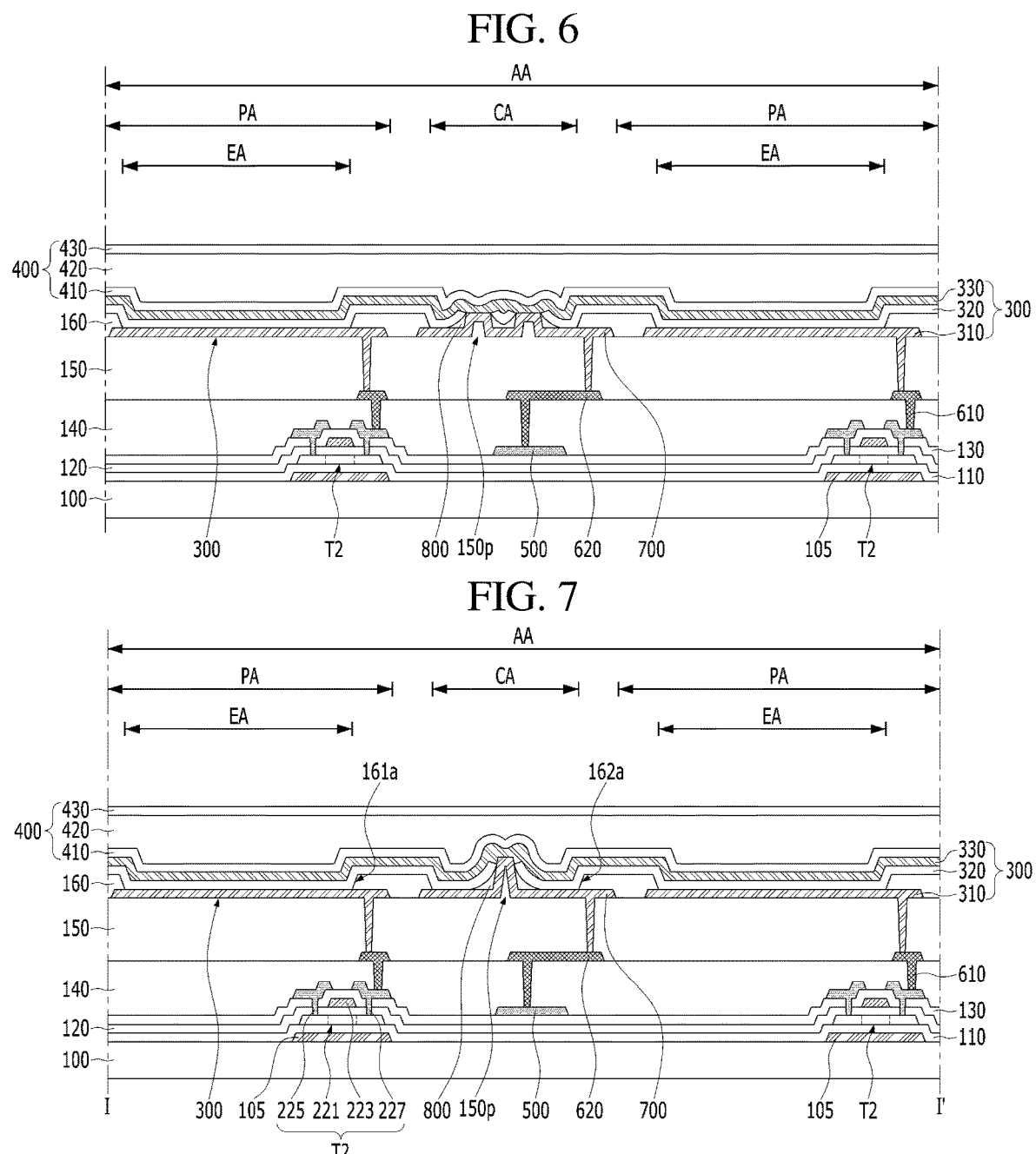
FIGS. 6 to 12 are views showing the display apparatus according to another embodiment of the present disclosure.

The display apparatus according to the embodiment of the present disclosure is described that a single upper protruding portion 150*p* is disposed on the contact area CA. However, in the display apparatus according to another embodiment of the present disclosure, the upper planarization layer 150 of the contact area CA may include a plurality of the upper protruding portions 150*p*. For example, in the display apparatus according to another embodiment of the present disclosure, the upper planarization 150 may include two upper protruding portions 150*p* overlapping with the contact area CA, as shown in FIG. 6. Thus, in the display apparatus according to another embodiment of the present disclosure, an area of the upper connection electrode 700 exposed by the reflow process may be increased. Therefore, in the display apparatus according to another embodiment of the present disclosure, the second electrode 330 of each light-emitting device 300 may be stably connected to the auxiliary electrode 500.

The display apparatus according to the embodiment of the present disclosure is described that the upper surface 150*pu* of the upper protruding portion 150*p* is disposed closer to the device substrate 100 than the upper surface of the bank insulating layer 160 opposite to the device substrate 100. However, in the display apparatus according to another embodiment of the present disclosure, a thickness of the upper protruding portion 150*p* may be larger than a thickness of the bank insulating layer 160, as shown in FIG. 7. Thus, in the display apparatus according to another embodiment of the present disclosure, the exposure of a portion of the upper connection electrode 700 by the reflow process may be rapidly performed. That is, in the display apparatus according to another embodiment of the present disclosure, a process time of exposing a portion of the upper connection electrode 700 may be minimized or at least reduced. Therefore, in the display apparatus according to another embodiment of the present disclosure, process efficiency may be improved, without the deterioration of the light-emitting layer 320.

Figure 8:
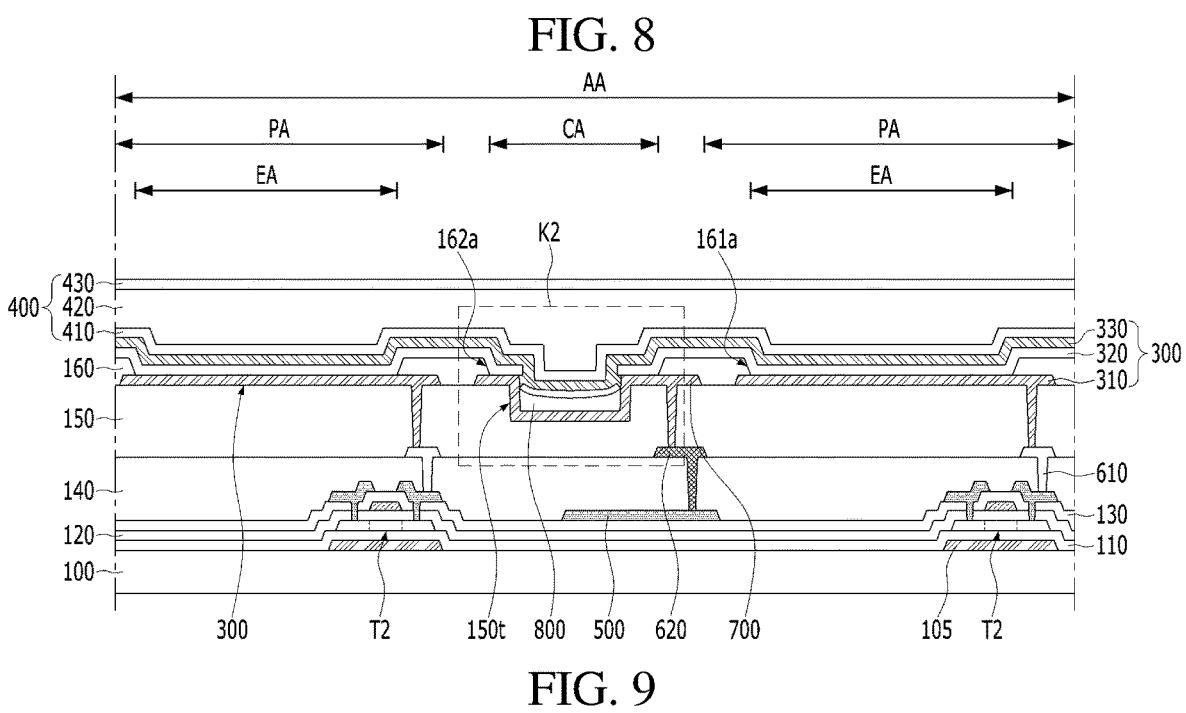
Figure 9:
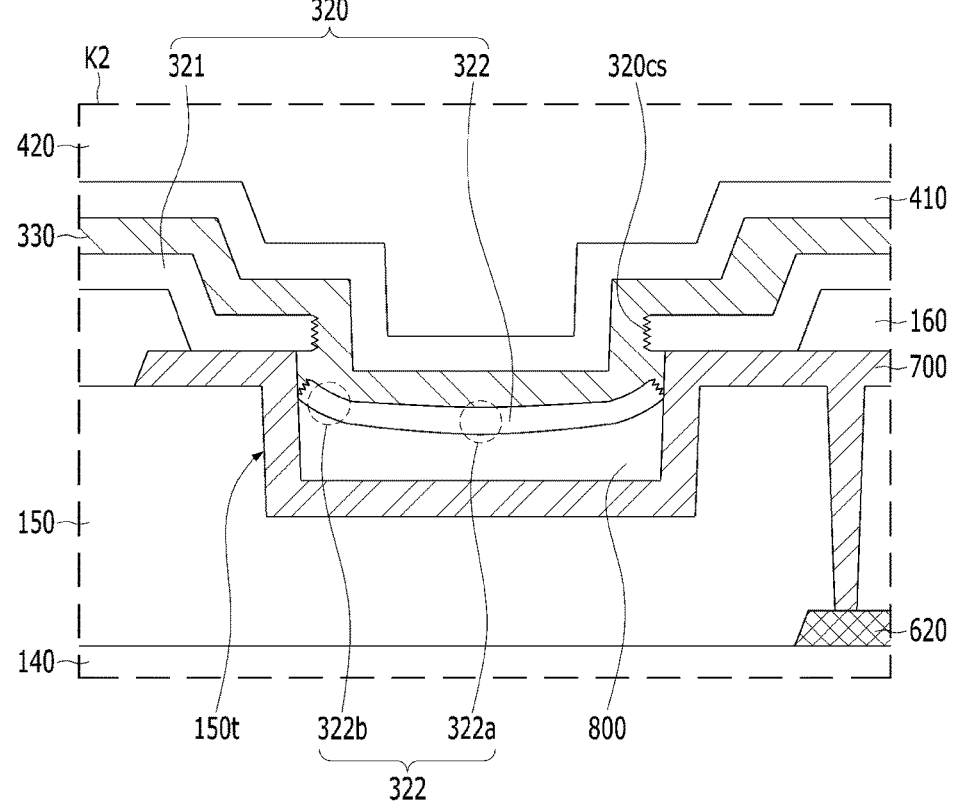

The display apparatus according to the embodiment of the present disclosure is described that the upper planarization layer 150 includes the upper protruding portion 150*p* overlapping with the contact area CA. However, in the display apparatus according to another embodiment of the present disclosure, the upper planarization layer 150 may have various shapes including an inclined surface overlapping with the contact area CA and an upper surface extending from the inclined surface. For example, in the display apparatus according to another embodiment of the present disclosure, the upper planarization layer 150 may include an upper groove 150*t* overlapping with the contact area CA, as shown in FIGS. 8 and 9. The upper groove 150*t* may include an inclined sidewall. The reflow pattern 800 may be disposed within the upper groove 150*t*. For example, the reflow pattern 800 may include a region having a concave shape toward the inclined sidewall of the upper groove 150*t*. The upper connection electrode 700 disposed between the upper planarization layer 150 and the reflow pattern 800 may extend beyond the upper groove 150*t*. For example, the upper connection electrode 700 may be connected to the lower connection electrode 620 by penetrating the upper planarization layer 150 at the outside of the upper groove 150*t*.

The light-emitting layer 320 of each light-emitting device 300 may include a first region 321 disposed on the corresponding first electrode 310 and the bank insulating layer 160, and a second region 322 disposed on the reflow pattern 800. The second region 322 may be spaced apart from the first region 311. The second electrode 330 of each light-emitting device 300 may be in direct contact with the upper connection electrode 700 between the first region 321 and the second region 322 of the corresponding light-emitting layer 320.

Figures 10, 11:
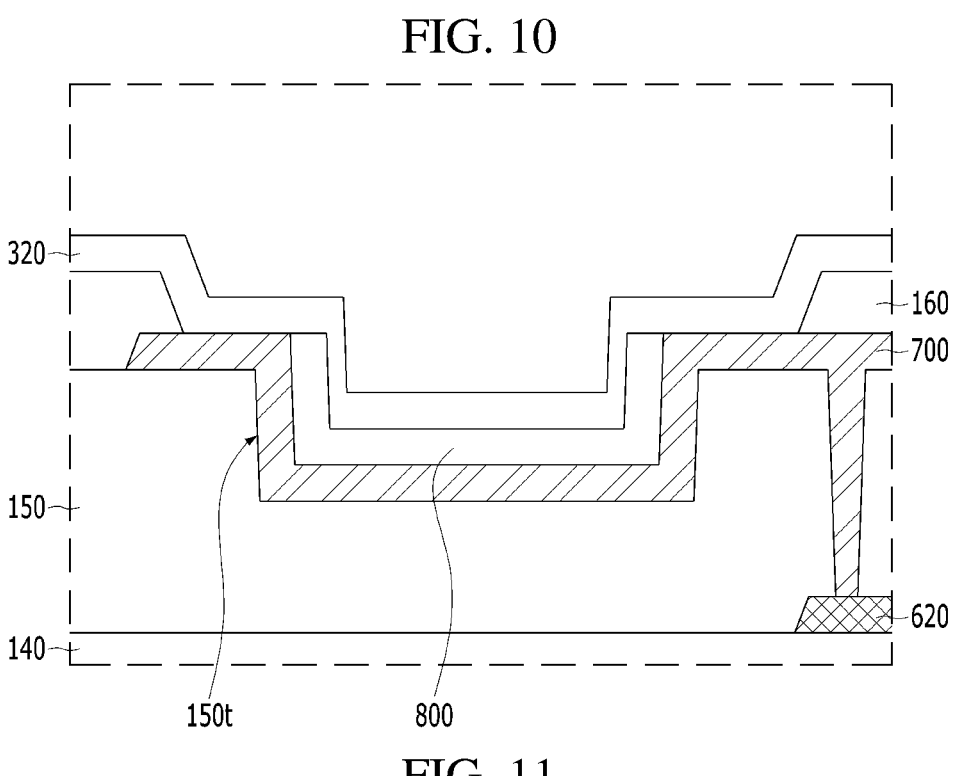

FIGS. 10 and 11 are views sequentially showing a method of forming the display apparatus according to another embodiment of the present disclosure.

The method of forming the display apparatus according to another embodiment of the present disclosure will be described with reference to FIGS. 8 to 11. First, the method of forming the display apparatus according to another embodiment of the present disclosure may include a step of forming the pixel driving circuit DC including the thin film transistors T2 on each pixel area PA of the device substrate 100, a step of forming the auxiliary electrode 500 on the contact area CA of the device substrate 100, a step of forming the lower planarization layer 140 on the pixel driving circuit DC of each pixel area PA and the auxiliary electrode 500, a step of forming the intermediate electrode 610 on the lower planarization layer 140 of each pixel area PA, a step of forming the lower connection electrode 620 on the lower planarization layer 140 of the contact area CA, a step of forming the upper planarization layer 150 including the upper groove 150*t* on the intermediate electrodes 610 and the lower connection electrode 620, a step of forming the first electrode 310 on the upper planarization layer 150 of each pixel area PA, a step of forming the upper connection electrode 700 covering a sidewall and a bottom surface of the upper groove 150t on the upper planarization layer 150 of the contact area CA, a step of forming the bank insulating layer 160 covering an edge of the first electrode 310 and an edge of the upper connection electrode 700, a step of forming the reflow pattern 800 extending the sidewall and the bottom surface of the upper groove 150t on the upper connection electrode 700, and a step of forming the light-emitting layer 320 on the device substrate 100 in which the bank insulating layer 160 and the reflow pattern 800 are formed, as shown in FIG. 10.

The upper groove 150t may overlap the contact area CA. For example, the step of forming the upper planarization layer 150 may include a step of recessing a portion of the upper planarization layer 150 overlapping with the contact area CA. The sidewall of the upper groove 150t may be formed to be inclined. The sidewall of the upper groove 150t may have a relatively great inclination angle. For example, the sidewall of the upper groove 150t may have an inclination angle greater than a sidewall of an opening of the bank insulating layer 160 overlapping with the contact area CA. Thus, in the method of forming the display apparatus according to another embodiment of the present disclosure, a portion of the light-emitting layer 320 formed on the sidewall of the upper groove 150t may have a relatively thin thickness.

The reflow pattern 800 may be formed within the upper groove 150t. For example, a portion of the upper connection electrode 700 disposed outside the upper groove 150t may be in direct contact with the light-emitting layer 320.

The method of forming the display apparatus according to another embodiment of the present disclosure may include a step of exposing a portion of the upper connection electrode 700 by the reflow process of the reflow pattern 800, as shown in FIG. 11.

The reflow pattern 800 may flow down onto the bottom surface of the upper groove 150t along the inclined sidewall of the upper groove 150t by the reflow process. For example, the reflow pattern 800 may include a region having a concave shape toward the inclined sidewall of the upper groove 150t. The light-emitting layer 320 may be moved together with the reflow pattern 800. For example, a portion of the light-emitting layer 320 formed on the inclined sidewall of the upper groove 150t may be tone by the reflow process. The light-emitting layer 320 may include the first region 321 disposed on the bank insulating layer 160 and the second region 322 disposed on the reflow pattern 800, wherein the second region 322 may be separated from the first region 321. A side surface 320cs of the first region 321 toward the second region 322 and a side surface of the second region 322 toward the first region 321 may have a relatively large surface roughness. An edge portion 322b of the second region 322 may have a thickness thinner than a central portion 322a of the second region 322. That is, in the method of forming the display apparatus according to another embodiment of the present disclosure, a portion of the upper connection electrode 700 may be exposed between the first region 321 and the second region 322 of the light-emitting layer 320 by the reflow process.

The method of forming the display apparatus according to another embodiment of the present disclosure may include a step of forming the second electrode 330 on the device substrate 100 in which a portion of the upper connection electrode 700 is exposed by the reflow pattern 800 and the light-emitting layer 320, and a step of forming the encapsulation unit 400 on the second electrode 330, as shown in FIGS. 8 and 9.

In the display apparatus according to another embodiment of the present disclosure, the second electrode 330 may be in direct contact with the upper connection electrode 700 between the first region 321 and the second region 322 of the light-emitting layer 320. That is, in the display apparatus according to another embodiment of the present disclosure, the second electrode 330 may be electrically connected to the auxiliary electrode 500 by the reflow process of the reflow pattern 800 formed in the upper groove 150t. Therefore, in the display apparatus according to another embodiment of the present disclosure, the degree of freedom for a shape of a portion of the upper planarization layer 150 overlapping the contact area CA may be improved.

Figure 12:
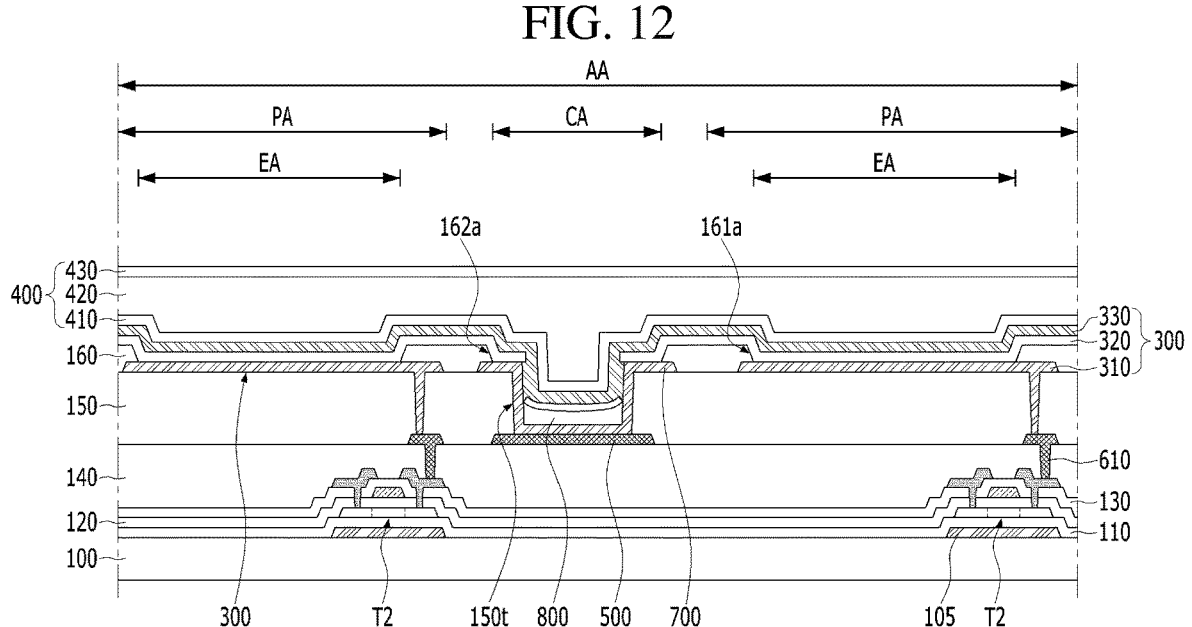

In the display apparatus according to another embodiment of the present disclosure, the auxiliary electrode 500 may be disposed between the lower planarization layer 140 and the upper planarization layer 150, as shown in FIG. 12. For example, the auxiliary electrode 500 may be disposed on a same layer as the intermediate electrodes 610. The auxiliary electrode 500 may include a same material as the intermediate electrodes 610. For example, the auxiliary electrode 500 may be formed simultaneously with the intermediate electrodes 610. Thus, in the display apparatus according to another embodiment of the present disclosure, a connection process of the upper connection electrode 700 and the auxiliary electrode 500 may be simplified.

The auxiliary electrode 500 may overlap the upper groove 150t. The upper groove 150t may penetrate the upper planarization layer 150. For example, the upper connection electrode 700 may be in direct contact with the auxiliary electrode 500 at the bottom surface of the upper groove 150t. Thus, in the display apparatus according to another embodiment of the present disclosure, a contact area between the upper connection electrode 700 and the auxiliary electrode 500 may be increased. Therefore, in the display apparatus according to another embodiment of the present disclosure, in the display apparatus according to another embodiment of the present disclosure, a stability of the electrical connection between the upper connection electrode 700 and the auxiliary electrode 500 may be improved.

In the result, the display apparatus according to the embodiments of the present disclosure may comprise the reflow pattern disposed between the light-emitting layer of each light-emitting device and the upper connection electrode electrically connected to the auxiliary electrode, wherein the light-emitting layer may expose at least a portion of the upper connection electrode by the reflow pattern. That is, in the display apparatus according to the embodiments of the present disclosure, an electrical connection between the second electrode of each light-emitting device and the auxiliary electrode may be not influenced by a process of forming the second electrode. And, in the display apparatus according to the embodiments of the present disclosure, a process of electrically connecting the second electrode of each light-emitting device and the auxiliary electrode may be minimized or at least reduced. Thus, in the display apparatus according to the embodiments of the present disclosure, the second electrode of each light-emitting device may be stably connected to the auxiliary electrode, without the restriction in a formation process and a material of the second electrode. Thereby, in the display apparatus according to the embodiments of the present disclosure, production energy may be reduced by process optimization.

What is claimed is:

1. A display apparatus comprising:

a device substrate including a pixel area and a contact area;

an auxiliary electrode on the contact area of the device substrate;

a planarization layer on the auxiliary electrode, the planarization layer including an inclined surface overlapping with the contact area and an upper surface extending from the inclined surface;

a connection electrode electrically connected to the auxiliary electrode, the connection electrode covering the inclined surface and the upper surface of the planarization layer;

a reflow pattern on the connection electrode, the reflow pattern exposing at least a portion of the connection electrode on the inclined surface and the upper surface; and a light-emitting device on the planarization layer of the pixel area, the light-emitting device including a first electrode, a light-emitting layer on the first electrode, and a second electrode on the light-emitting layer, wherein the light-emitting layer exposes at least a portion of the connection electrode in the portion of the connection electrode exposed by the reflow pattern, and wherein the second electrode contacts the portion of the connection electrode exposed by the light-emitting layer.

2. The display apparatus according to claim 1, wherein the reflow pattern includes a region having a concave shape toward the inclined surface.

3. The display apparatus according to claim 1, further comprising:

a bank insulating layer on the planarization layer, the bank insulating layer covering an edge of the first electrode and an edge of the connection electrode, and wherein the reflow pattern includes a material different from a material of the bank insulating layer.

4. The display apparatus according to claim 3, wherein the connection electrode includes a same material as the first electrode of the light-emitting device.

5. The display apparatus according to claim 3, wherein the upper surface of the planarization layer has a length smaller than the inclined surface of the planarization layer.

6. The display apparatus according to claim 5, wherein the planarization layer includes an upper protruding portion having the inclined surface and the upper surface, an upper protruding portion of the planarization layer has a thickness that is larger than a thickness of the bank insulating layer.

7. The display apparatus according to claim 1, wherein an adhesion between the connection electrode and the reflow pattern and an adhesion between the connection electrode and the light-emitting layer is less than an adhesion between the reflow pattern and the light-emitting layer.

8. The display apparatus according to claim 7, wherein the reflow pattern includes an organic insulating material.

9. A display apparatus comprising:

a device substrate including a pixel area and a contact area;

an upper planarization layer on the pixel area and the contact area of the device substrate, the upper planarization layer including an upper groove overlapping with the contact area;

a reflow pattern in the upper groove of the upper planarization layer, the reflow pattern having a concave shape toward the device substrate;

a connection electrode between the upper planarization layer and the reflow pattern, the connection electrode extending beyond the upper groove;

an auxiliary electrode between the contact area of the device substrate and the upper planarization layer, the auxiliary electrode electrically connected to the connection electrode; and a light-emitting device on the upper planarization layer of the pixel area, the light-emitting device including a first electrode, a light-emitting layer on the first electrode, and a second electrode on the light-emitting layer, wherein the light-emitting layer includes a first region on the first electrode and a second region on the reflow pattern, and wherein the second electrode is in contact with the connection electrode between the first region and the second region of the light-emitting layer.

10. The display apparatus according to claim 9, wherein a maximum thickness of the reflow pattern is smaller than a depth of the upper groove.

11. The display apparatus according to claim 9, wherein the second region of the light-emitting layer includes a region having a thickness smaller than a thickness of the first region of the light-emitting layer.

12. The display apparatus according to claim 11, further comprising:

a bank insulating layer on the upper planarization layer, the bank insulating layer covering an edge of the first electrode, wherein the bank insulating layer includes an opening overlapping with the upper groove of the upper planarization layer, and a sidewall of the upper groove has an inclination angle greater than a sidewall of the opening.

13. The display apparatus according to claim 11, further comprising:

a lower planarization layer between the device substrate and the upper planarization layer, wherein the auxiliary electrode is between the lower planarization layer and the upper planarization layer of the contact area.

14. The display apparatus according to claim 13, wherein the upper groove penetrates the upper planarization layer, and the connection electrode contacts the auxiliary electrode at a bottom surface of the upper groove.

15. The display apparatus according to claim 13, further comprising:

a thin film transistor between the pixel area of the device substrate and the lower planarization layer; and an intermediate electrode between the lower planarization layer and the upper planarization layer of the pixel area, wherein the auxiliary electrode includes a same material as the intermediate electrode.

* * * * *